United States Patent [19]
Whitecar et al.

[11] Patent Number: 5,815,584
[45] Date of Patent: Sep. 29, 1998

[54] AUTOMATIC DETECTION OF SHORTED LOUDSPEAKERS IN AUTOMOTIVE AUDIO SYSTEMS

[75] Inventors: John Elliott Whitecar; Andrew Cyril Krochmal, both of Plymouth, Mich.

[73] Assignee: Ford Motor Company, Dearborn, Mich.

[21] Appl. No.: 745,768

[22] Filed: Nov. 8, 1996

[51] Int. Cl.$^6$ .................................................... H04B 1/00
[52] U.S. Cl. ........................... 381/86; 381/59; 455/226.1
[58] Field of Search .................................. 381/86, 77, 55, 381/58, 59, 96; 455/226.1, 226.4

[56] References Cited

U.S. PATENT DOCUMENTS

| | | |
|---|---|---|
| 3,602,819 | 8/1971 | Abbott . |
| 3,755,741 | 8/1973 | Stover . |
| 4,060,767 | 11/1977 | Lohrmann . |
| 4,124,780 | 11/1978 | Ogita . |
| 4,234,964 | 11/1980 | Cieslak et al. . |
| 4,245,352 | 1/1981 | Karpowycz et al. . |
| 4,322,857 | 3/1982 | Grohmann et al. . |
| 4,346,268 | 8/1982 | Geerling . |
| 4,864,639 | 9/1989 | Dapore et al. . |
| 4,978,926 | 12/1990 | Zerod et al. . |
| 5,042,070 | 8/1991 | Linna et al. . |
| 5,187,809 | 2/1993 | Rich et al. . |
| 5,255,324 | 10/1993 | Brewer et al. ........................... 381/107 |
| 5,394,476 | 2/1995 | Rollins et al. ........................... 381/104 |
| 5,450,624 | 9/1995 | Porambo et al. ..................... 455/226.4 |

FOREIGN PATENT DOCUMENTS

| | | |
|---|---|---|
| 0 027 078 | 4/1981 | European Pat. Off. . |
| 267 616 | 5/1989 | German Dem. Rep. . |
| 36 27 960 | 9/1987 | Germany . |
| 37 09 556 | 10/1988 | Germany . |
| 57-95734 | 6/1982 | Japan . |
| 3-181233 | 8/1991 | Japan . |
| 2 199 466 | 7/1988 | United Kingdom . |

*Primary Examiner*—Vivian Chang
*Attorney, Agent, or Firm*—Mark Mollon

[57] ABSTRACT

The connections of speakers in an automotive audio system are automatically checked during the assembly process to determine whether any speakers are shorted or have wires incorrectly connected to battery voltage or to ground. A signal diagnostic line can be used to indicate a plurality of different conditions. In addition, the actions of an audio limiting function can be monitored to detect shorts.

8 Claims, 5 Drawing Sheets

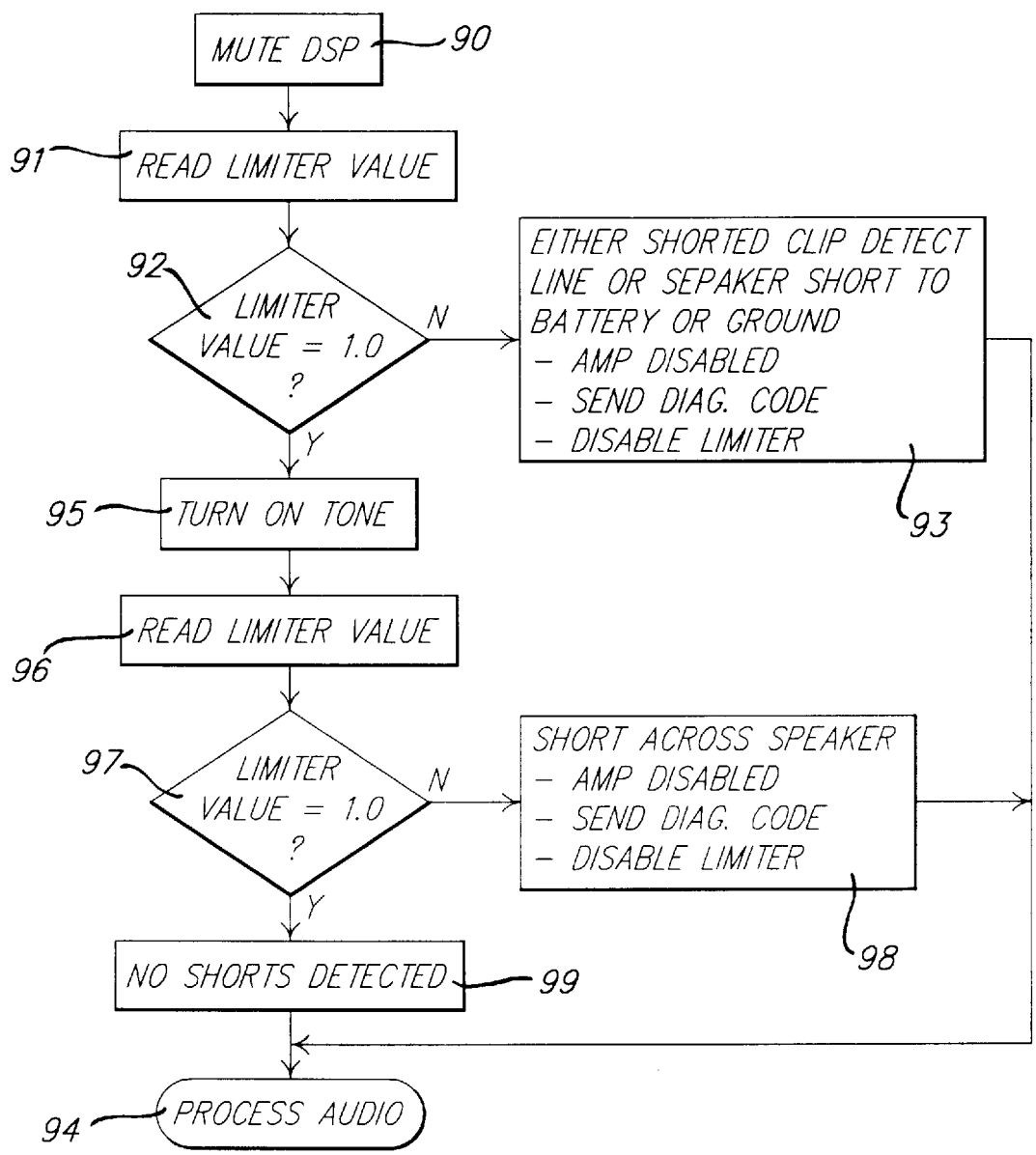

though, as explained above, the manual test is of low efficiency and is not always accurate due to the noisy environment in an assembly plant.

AUTOMATIC DETECTION OF SHORTED LOUDSPEAKERS IN AUTOMOTIVE AUDIO SYSTEMS

BACKGROUND OF THE INVENTION

The present invention relates in general to detecting shorted speakers in automotive audio systems, and, more specifically, to use of a diagnostic signal from a power amplifier to determine output conditions of the power amplifier as they are affected by the speaker connections.

The overall success of an assembly process for mass production of automobiles depends upon its efficiency and ability to provide quality products. A particularly important part of a vehicle which is subjected to potential problems during assembly is electrical wiring. Possible defects include incorrect interconnection of wiring or damage to wiring causing undesired short or open circuits.

With respect to automotive audio systems, the most frequently experienced wiring problems involve the speaker wiring. Problems include failure to properly join harness wiring to the speaker terminals, bent terminals or wiring making undesired connection to exposed metal bodies surfaces, and pinching of mislocated or misfed wires between body structures. In order to verify proper connection of audio system speakers, prior art manufacturing operations required a person to sit in a vehicle to perform a listening test to determine if all speakers were connected and operating properly. However, a vehicle assembly plant typically has a loud ambient noise level making it difficult to detect the absence of noise from a single speaker. Furthermore, such a manual test is low in efficiency.

SUMMARY OF THE INVENTION

The present invention overcomes the deficiencies of the prior art by providing automatic detection of speaker interconnection during the automotive assembly process.

In one aspect, the invention provides an automotive audio system for automatically detecting improper connection of speakers comprising an audio processing unit including a microcontroller and a digital signal processor. A power amplifier having at least one power stage with an input connected to the audio processing unit includes speaker outputs for connecting to a speaker. The power amplifier further includes detectors for detecting proper conditions within the power stage and a logic circuit coupled to the detector for communicating a diagnostic signal to the audio processing unit. The audio processing unit provides a muted signal to the power stage input while checking the diagnostic signal for an indication of a short circuit between one of the speaker outputs and either battery or ground, and then provides a low-level audio signal to the power stage input while checking the diagnostic signal for an indication of a short circuit between the speaker outputs.

In another aspect of the invention, a method of detecting improper connection of speakers in an automotive audio system including an audio processing unit providing an audio input to a power stage of a power amplifier comprises the steps of operating the power amplifier in an unmuted condition. The audio input is muted and a check is made whether the power stage is operating within a predetermined safe-operating-area. An indication is made that a speaker is shorted to one of battery or ground if the power stage is not operating within the predetermined safe-operating-area. Then, a low level audio signal is provided on the audio input. A check is made whether the power stage is operating within the predetermined safe-operating-area. An indication is made that there is a short across a speaker if the power stage is not operating within the predetermined safe-operating-area.

BRIEF DESCRIPTION OF THE DRAWINGS

FIG. 6 is a flow chart showing the method of a second alternative embodiment.

DETAILED DESCRIPTION OF PREFERRED EMBODIMENTS

Figure 1:
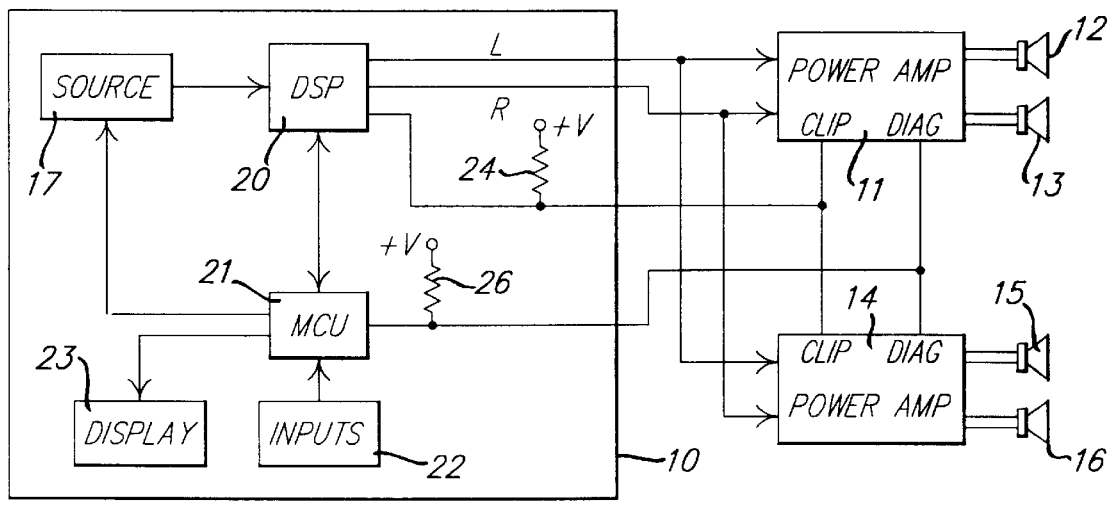
FIG. 1 is a block diagram showing the audio system of the present invention.

FIG. 1 shows an automotive audio system including an audio processing unit or head unit 10 and power amplifiers 11 and 14 driving speakers 12, 13, 15, and 16. Power amps 11 and 14 each drive left and right stereo speakers for front and rear speaker sets, respectively.

Processing unit 10 includes an audio source 17 such as a radio tuner, cassette player, or compact disc player. An audio signal from source 17 is provided to the input of a digital signal processor (DSP) 20 which outputs left and right stereo signals. A microcontroller unit (MCU) 21 communicates with DSP 20 and source 17 to control operation of the audio system. MCU 21 receives input commands from inputs 22 which may include push-button operator controls or an interface to a multiplex network whereby commands may be received from other locations. A display 23 is connected to MCU 21 for displaying status of the audio processing unit to allow adjustment of audio parameters such as volume, balance and fade.

Power amps 11 and 14 provide outputs for a clip detector and a diagnostic signal. The clip detector outputs indicate moments when clipping occurs in the output signal of the respective power amplifier. The clip detect outputs of power amps 11 and 14 are connected together and to a pull-up resistor 24 and an input of DSP 20 in audio processing unit 10. The clip detect outputs of power 11 and 14 are configured to provide a current sink (i.e., a direct connection to ground) when clipping occurs. Thus, the occurrence of clipping pulls the voltage at resistor 24 to ground, whereas the junction is at a high voltage from voltage supply +V when clipping is not occurring. Likewise, a DIAG diagnostic signal from power amps 11 and 14 has a value which provides a ground connection when power amps 11 and 14 sense particular diagnostic conditions within the power amps. The DIAG signal is connected to a pull-up resistor 26 which is further connected to an input of MCU 21.

Figure 2:
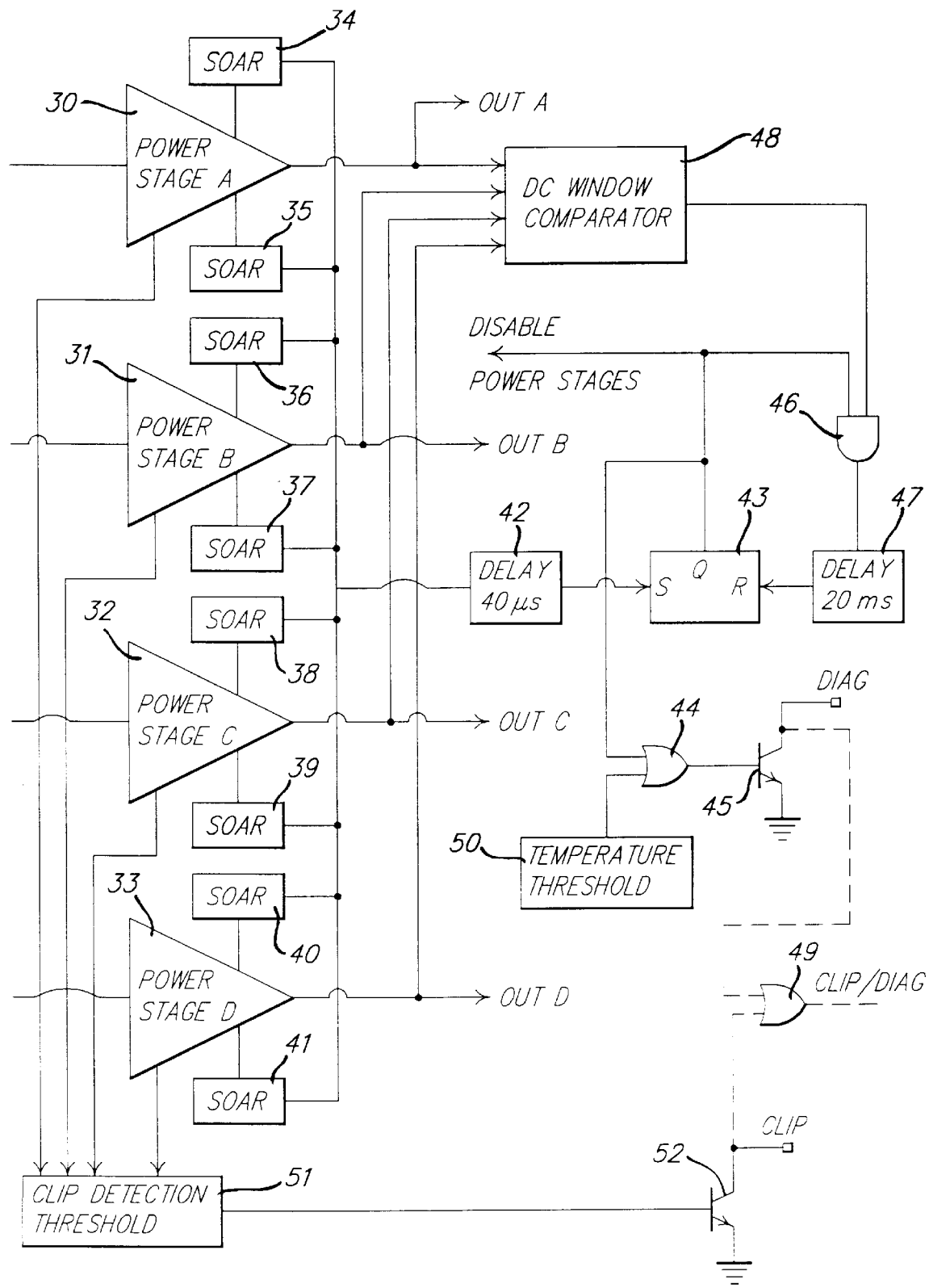
FIG. 2 is a block diagram showing the power amplifier used in the present invention in greater detail.

As shown in FIG. 2, each power amplifier includes a plurality of power stages A, B, C, and D indicated at 30–33. Each power stage is coupled to a pair of "safe-operating-area region"("SOAR") detectors 34–41, respectively. The outputs of SOAR's 34–41 are wired together providing a "wired-OR" line carrying a signal which indicates when any power stage is operating outside of its respective safe-operating-area. Power stages A, B, C, and D provide respective outputs OUT A, OUT B, OUT C, and OUT D. OUT A and OUT B are connected to differentially drive one speaker, while OUT C and OUT D are differentially connected to drive the speaker of the other stereo channel.

A clip detection threshold circuit 51 is connected to power stages A–D to indicate when a predetermined amount of clipping distortion is present within the power stages. Upon the occurrence of clipping distortion above the threshold, clip detection threshold circuit 51 activates a transistor 52 thereby connecting the clip detection output terminal to ground.

The design of power stages A–D, safe-operating-area region detectors 34–41, and clip detection threshold circuit 51 are conventional and are known in the art. SOAR detectors have been used for the disabling of the power stages when operation of a power stage is detected outside of its safe-operating-area.

The present invention uses the occurrence of operation outside the safe-operating-areas of the power stages to provide diagnostic information to the audio processing unit to thereby permit automatic detection of improper speaker connections. For example, when there is no audio input signal being provided to the inputs of the power stages, the output voltages of all the power stages should equal the normal DC bias voltage used by the audio system and all the power stages should be within their safe-operating-areas. Thus, an automatic test is possible. For example, a DC window comparator 48 compares the output voltages OUT A to OUT D each with a small DC window surrounding the desired bias voltage. In the event that any power stage output is outside the bias voltage window when the audio input to the power stages is muted, then a logical low signal is provided to one input of an AND-gate 46. The occurrence of this condition is examined by logic circuitry and converted to a DIAG signal as will be described below.

The wired-OR output of SOAR's 34–41 is connected to a delay circuit 42 for providing a 40 microsecond delay following a trigger signal received from the SOAR's. After the 40 microsecond delay, a positive going signal pulse is provided to the SET input of an SR flip-flop 43. The Q output of flip-flop 43 is connected to power stages A–D in order to disable the power stages whenever operation occurs outside the safe-operating-area. The Q output is also connected to the second input of AND-gate 46 and to one input of an OR-gate 44. The output of OR-gate 44 is connected to the base of a transistor 45 used to selectably connect the DIAG signal output to ground. The second input of OR-gate 44 is connected to a temperature threshold circuit 50 which provides a high logic level whenever the power amplifier operates at a temperature above a predetermined threshold.

The output of AND-gate 46 is connected to the input of a delay circuit 47 for providing a 20 millisecond delay after which a positive going pulse signal is provided to the RESET input of flip-flop 43.

The operation of the circuit and FIG. 2 will be described in connection with the flowchart of FIG. 3. In step 53, the radio is powered up and the outputs of the power amplifier and the digital signal processor are muted (i.e., set to no signal or zero). The power amplifier is muted by disabling the power stages as is known in the art. In step 54, the power amplifier is unmuted (i.e., the power stages are no longer disabled). At this time, the audio processing unit continues to provide a muted input signal to the power amplifier. Therefore, the output voltage of each power stage should be equal to the DC bias voltage of the power amplifier. If, however, one of the speaker connections is shorted either to ground or to a source of battery voltage, the output of a power stage would be at other than the DC bias voltage. Consequently, one or more SOAR's will detect that a corresponding power stage is outside its safe-operating-area and a triggering signal will be sent to delay circuit 42 in FIG. 2. As a result, flip-flop 43 is set and the Q output changes to a high logic level. The high logic level signal is transmitted through OR-gate 44 and turns on transistor 45 thus pulling the DIAG line low.

For reasons that will be explained later, it is desired that flip-flop 43 reset itself after a predetermined delay of 20 milliseconds so that a pulse width modulated signal can be produced to indicate speaker short circuits. In the case of detecting shorts to ground or to battery voltage (rather than shorts across the speaker), the pulse width signal is not wanted and so a further DC window comparator is provided to prevent continued production of the pulse width modulated signal as follows. Output signals OUT A–OUT D from power stages A–D are each respectively compared with a DC window containing the DC bias voltage of the power amplifier. If the voltage of any output signal OUT A–OUT D is outside the window, a low logic level signal is provided from comparator 48 to AND-gate 46 (acting as a transmission gate). Thus, when a short to battery or to ground is present, the high logic level signal from the Q output of flip-flop 43 is prevented from reaching the input to delay circuit 47. This prevents flip-flop 43 from being continually set and reset according to the 40 microsecond and 20 millisecond delays.

In step 56, a check is made to determine if the DIAG signal was low. If it is, then in step 57 such short is detected and the microcontroller unit sends a diagnostic code to the display to indicate the presence of the short to battery or to ground. In addition, the power amplifier is automatically disabled internally. Then, the audio system processes audio in step 58 for any power amplifier not suffering from the short to battery or to ground.

If the DIAG signal was not found to be low in step 56, then a test is made to check for a short circuit between speaker outputs. Thus, in step 60, a low level tone is turned on as an input to the power amplifier. In the event of a shorted speaker, the low level tone at the power amplifier input will be enough to cause clipping of the power amplifier stages and will cause safe-operating-area detectors 34–40 to detect operation outside the safe-operating-area. After a 40 microsecond delay, delay circuit 42 sets flip-flop 43 thereby 1) disabling the power stages, 2) initiating the counting of the 20 millisecond delay in delay circuit 47, and 3) forcing the DIAG line low through OR-gate 44 and transistor 45. At the end of the 20 millisecond delay, delay circuit 47 provides a positive pulse signal to the RESET input of flip-flop 43 causing the Q output to switch to a low logic level by turning off transistor 45 and returning the DIAG line to a high level. In addition, the power stages are re-enable. However, due to the short circuit existing, the power stages will again operate outside their safe-operating-areas causing flip-flop 43 to be set through delay circuit 42. Thus, a DIAG signal having a pulse width modulated waveform with a high logic level for 40 microseconds and a low logic level for 20 milliseconds is generated. If at some point the short circuit is corrected, the power amplifier will begin to operate normally.

Figure 3:
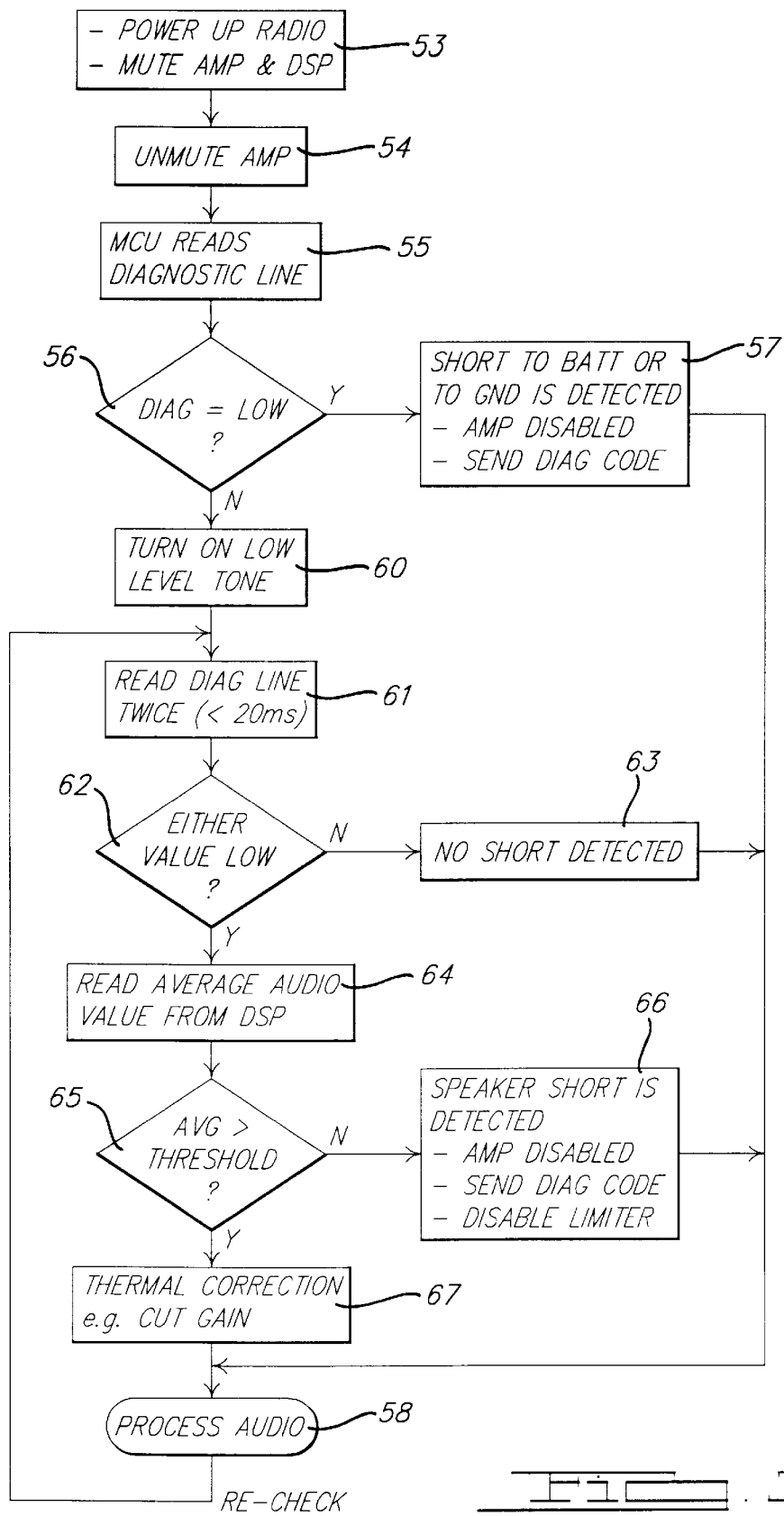
FIG. 3 is a flow chart showing the operation of the present invention.

In step 61 in FIG. 3, the DIAG line is read twice, the successive readings occurring less than 20 milliseconds apart so that the low level of the DIAG will be present during at least one of the readings if a speaker is short circuited. In step 62, a check is made to determine whether either value read from the DIAG line was low. If not, then no speaker short is detected in step 63 and audio signals are processed normally in step 58. If at least one value was low in step 62, then an average audio value is read from the DSP in step 64. The average audio value is an indicator of the amount of power that should be consumed by the power amplifier if the speakers are operating normally. In step 65, a check is made to determine whether the average value is greater than a threshold, in which case the cause for operation of a power stage outside its safe-operating-area is assumed to be a temperature problem. Thus, if the average is greater than the threshold then a thermal correction is made in step 67, such as a gain cut to reduce power consumption. If the audio signal level is not great enough to be causing a heat overload, then a speaker short is detected in step 66 and a diagnostic code identifying a speaker short is sent to the display, the power amp is internally disabled, and the signal limiter in the DSP is disabled so that any non-disabled power amplifier in the system can operate at normal volume. Then, audio is processed in step 58 and a periodical recheck can be made for a clearance of the shorted speaker by reinitiating the sequence prior to step 61.

Figure 4:
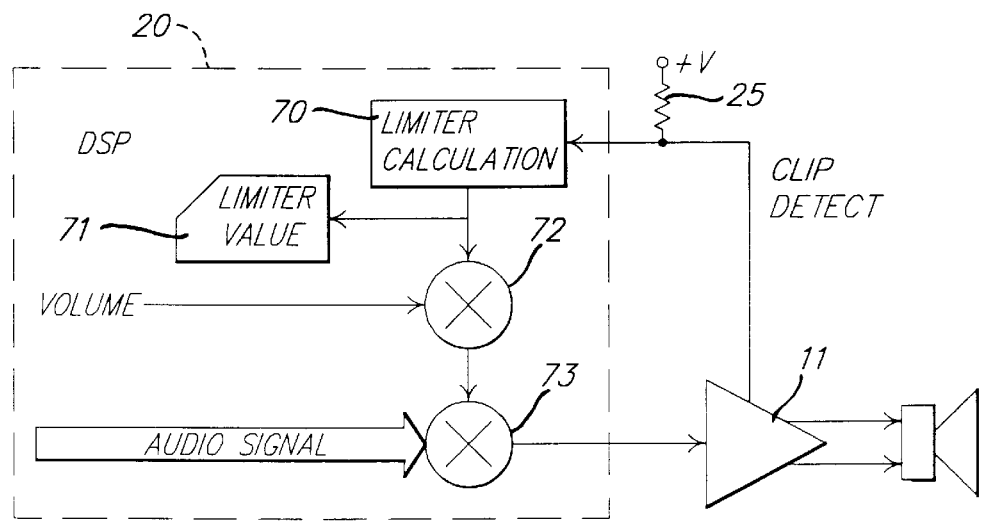
FIG. 4 is a block diagram showing portions of the audio system in an alternate embodiment.

FIG. 4 shows the DSP limiter function in greater detail. A clip detect signal provided from power amp 11 in conjunction with a pull-up resistor 25 is input to DSP 20 and is used in a limiter calculation which relates the severity of clipping with a particular limiter value. Specifically, the limiter value is reduced from a maximum value of 1.0 to a possible minimum value of 0.1 at a predetermined attack rate during clipping and is restored toward 1.0 at a slower decay rate when clipping is not present. Thus, a limiter calculation 70 produces a limiter value 71 which is stored in DSP 20 and is provided as a multiplier input to a multiplier 72 to reduce the volume command. The output of multiplier 72 is provided to a multiplier 73 which multiplies the audio signal which is then provided to power amplifier 11.

Figure 5:
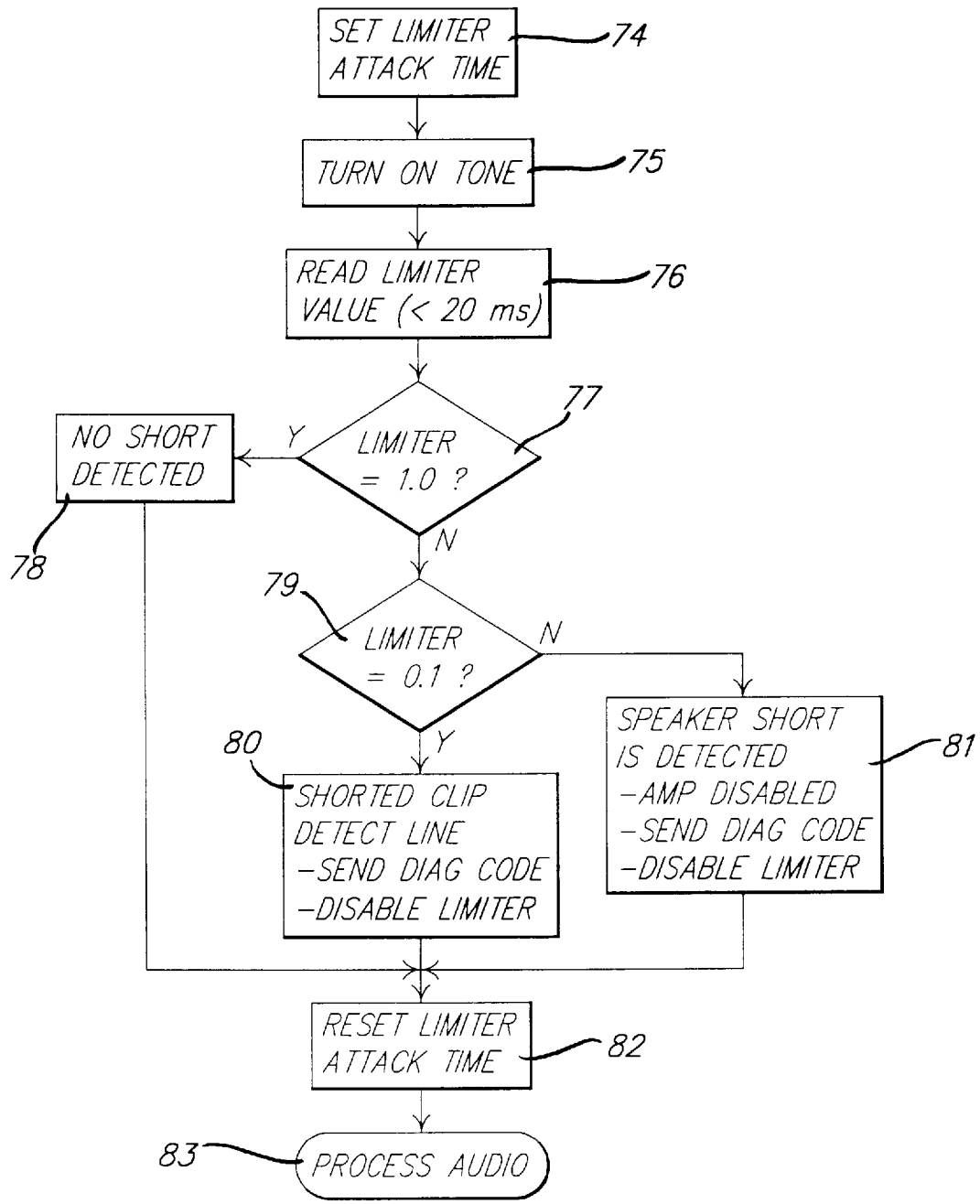
FIG. 5 is a flow chart showing the method of a first alternative embodiment.

In a first alternative embodiment, the limiter value can be used not only to detect speaker shorts (i.e., without using a diagnostic signal) but to also detect when the clip detect signal line has been shorted. Thus, FIG. 5 shows a method wherein the limiter attack rate is set to 100% in step 74 so that the limiter value will respond quickly to any clipping resulting from a low level tone that is turned on in step 75 (clipping can only occur during the 40 microsecond delay times when the amplifier is not disabled). The limiter value is read in step 76. The value should be read within 20 milliseconds.

When no clipping is detected, the limiter value is equal to 1.0 (i.e., a value which provides no limiting). In step 77, the limiter value is checked to determine whether it exactly equals 1.0. If the limiter value does equal 1.0, then there is no shorted speaker and the clip detect line cannot be shorted either. Thus, no short is detected in step 78, the limiter attack rate is reset to its normal value in step 82, and audio is processed normally beginning at step 83.

If the limiter value is other than 1.0, then a check is made to determine whether the limiter value equals 0.1 in step 79. A value of 0.1 is the maximum amount of limiting and indicates continuous clipping. Thus, if the limiter value does equal 0.1, a shorted clip detected line is detected in step 80 since only a shorted line could produce continuous clipping. In the event of continuous clipping, a diagnostic code is sent to the display in step 80 and the limiting function is disabled prior to resetting the limiter attack rate in step 82 and processing audio in step 83. The limiter is disabled so that other power amplifiers and speakers will operate normally and so that a person can identify which speaker is inoperative due to the short.

If in step 79, the limiter does not equal 0.1 (in other words, the limiter value lies between 1.0 and 0.1), then a speaker short is detected since clipping is occurring even though the tone input to the power amplifier is of a low level. In step 81, the power amplifier is disabled internally, a special diagnostic code is sent to the display, and the limiter is disabled (i.e., set to 1.0) prior to resetting the limiter attack rate in step 82 and processing audio at step 83.

In a second alternative embodiment, the clip detect signal and the DIAG signal are or'ed together in an OR-gate 49 shown connected to transistors 45 and 52 by dashed lines in FIG. 2 to produce a combined CLIP/DIAG signal. This reduces the number of interface wires required by the audio system but necessitates use of the PWM signals to distinguish between diagnostic information and clip detect information.

FIG. 6 shows a flowchart of this second alternative embodiment wherein the DSP output is muted in step 90. The limiter value is read in step 91. In step 92, the limiter value is checked to determine whether it exactly equals 1.0. If the limiter value is other than 1.0, then either a shorted clip detect line or a short to battery or ground is determined in step 93. A diagnostic code is sent to the display and the limiting function is disabled prior to processing audio in step 94. The limiter is disabled so that any other power amplifiers and speakers in the system can operate normally and so that a person can identify which speaker is inoperative due to the short.

If in step 92 the limiter does equal 1.0, then a low level tone is applied by the DSP in step 95. The limiter value is read in step 96 and checked in step 97 to determine whether it is equal to 1.0. If it is less than 1.0, then a speaker short is detected in step 98 since clipping is occurring even though the tone input to the power amplifier is of a low level. The power amplifier is disabled internally, a special diagnostic code is sent to the display, and the limiter is disabled (i.e., set to 1.0) prior to processing audio at step 94. Otherwise, no shorts are detected in step 99 and audio is processed normally in step 94.

When power is first applied to an audio system during the automobile assembly process, an automatic check is thus made for any speaker short including shorts to battery, to ground, or between speaker terminals or a short of the clip detect line. If any such short exists, a diagnostic code is displayed on the audio processing unit. Based on the code displayed, the assembly operator can verify and correct any short circuits. In addition, the microcontroller unit may send a diagnostic code via a multiplex network to another location such as a tester connected to a multiplex link of the vehicle.

What is claimed is:

1. A method of detecting improper connection of speakers in an automotive audio system including an audio processing unit providing an audio input to a power stage of a power amplifier, said method comprising the steps of:

operating said power amplifier in an unmuted condition;

muting said audio input;

checking whether said power stage is operating within a predetermined safe-operating-area;

indicating that a speaker is shorted to one of battery or ground if said power stage is not operating within said predetermined safe-operating-area;

providing a low level audio signal on said audio input;

checking whether said power stage is operating within said predetermined safe-operating-area; and indicating that there is a short across a speaker if said power stage is not operating within said predetermined safe-operating-area.

2. The method of claim 1 wherein, prior to indicating a short across a speaker, a check is made to determine whether said power stage is operating within a predetermined temperature condition.

3. The method of claim 1 wherein said power amplifier provides a clip detect signal to said audio processing unit indicating times when clipping is occurring in said power amplifier, wherein said digital signal processor determines a limiting value in response to said clip detect signal to reduce occurrence of clipping, and wherein said method further comprises the steps of:

comparing said limiting value with a predetermined value to detect a short.

4. A method of detecting improper connection of speakers in an automotive audio system including an audio processing unit providing an audio input to a power stage of a power amplifier, wherein said power amplifier provides a clip detect signal to said audio processing unit indicating times when clipping is occurring in said power amplifier, and wherein said digital signal processor determines a limiting value in response to said clip detect signal to reduce occurrence of clipping, said method comprising the steps of:

operating said power amplifier in an unmuted condition;

muting said audio input;

checking whether said power stage is operating within a predetermined safe-operating-area;

indicating that a speaker is shorted to one of battery or ground if said power stage is not operating within said predetermined safe-operating-area;

providing a low level audio signal on said audio input;

monitoring said clip detect signal;

determining a limiter value corresponding to a severity of clipping that is monitored;

operating said audio system in a normal manner if said limiter value indicates substantially no clipping during said low level audio signal;

indicating a shorted clip detect signal if said limiter value indicates substantially constant clipping during said low level audio signal; and indicating a shorted speaker signal if said limiter value indicates an intermediate amount of clipping during said low level audio signal.

5. The method of claim 4 further comprising the step of operating said audio system with said limiting value disabled if said limiting value indicated any occurrence of clipping during said low level audio signal.

6. An automotive audio system for automatically detecting improper connection of speakers, comprising:

an audio processing unit including a microcontroller and a digital signal processor; and a power amplifier having at least one power stage with an input connected to said audio processing unit, said power amplifier including speaker outputs for connecting to a speaker, detectors for detecting proper conditions within said power stage including a safe-operating-area monitor connected to said power stage, and a logic circuit coupled to said detectors for communicating a diagnostic signal to said audio processing unit in response to said safe-operating-area monitor;

wherein said audio processing unit provides a muted signal to said power stage input while checking said diagnostic signal for an indication of a short circuit between one of said speaker outputs and either battery or ground, and then providing a low-level audio signal to said power stage input while checking said diagnostic signal for an indication of a short circuit between said speaker outputs.

7. The audio system of claim 6 wherein said detectors include a DC window comparator connected to said speaker outputs, and wherein said logic circuit generates said diagnostic signal according to a first encoding if said DC window comparator detects a voltage outside a predetermined DC window during said muted signal and according to a second encoding if said safe-operating-area monitors detect operation of said power stages outside a predetermined safe-operating-area during said low level audio signal.

8. The audio system of claim 6 wherein said low level audio signal is comprised of a tone generated by said digital signal processor.

* * * * *